US012772440B2

(12) United States Patent
Kang et al.

(10) Patent No.: US 12,772,440 B2
(45) Date of Patent: Oct. 20, 2026

(54) METHOD AND STRUCTURE OF LOW-K SPACER USING POST-TREATMENT FOR MEMORY APPLICATIONS

(71) Applicant: Applied Materials, Inc., Santa Clara, CA (US)

(72) Inventors: Chang Seok Kang, Santa Clara, CA (US); Raghuveer Satya Makala, Campbell, CA (US); Fredrick Fishburn, Belmont, CA (US); Hsueh Chung Chen, Cohoes, NY (US); Balasubramanian Pranatharthiharan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 379 days.

(21) Appl. No.: 18/662,620

(22) Filed: May 13, 2024

(65) Prior Publication Data

US 2025/0351335 A1 Nov. 13, 2025

(51) Int. Cl.
*H10B 12/00* (2023.01)
*H10B 80/00* (2023.01)

(52) U.S. Cl.
CPC ........... *H10B 12/482* (2023.02); *H10B 12/02* (2023.02); *H10B 80/00* (2023.02)

(58) Field of Classification Search
CPC ....... H10B 12/482; H10B 80/00; H10B 12/02
USPC ........................................................... 257/296
See application file for complete search history.

(56) References Cited

U.S. PATENT DOCUMENTS

| | | | |
|---|---|---|---|
| 11,665,886 B2 | 5/2023 | Wu | |
| 2008/0102578 A1 | 5/2008 | Schlosser | |
| 2014/0085959 A1 | 3/2014 | Saraswat et al. | |
| 2015/0099344 A1 | 4/2015 | Kim et al. | |
| 2017/0018301 A1 | 1/2017 | Kilmer et al. | |
| 2018/0323199 A1 | 11/2018 | Roberts et al. | |
| 2018/0331073 A1 | 11/2018 | Sekar et al. | |
| 2019/0296026 A1* | 9/2019 | Ji | H10B 12/0335 |
| 2020/0251151 A1 | 8/2020 | Kang et al. | |
| 2022/0302144 A1* | 9/2022 | Cheng | G11C 11/221 |
| 2022/0310626 A1 | 9/2022 | Liu et al. | |
| 2022/0352179 A1* | 11/2022 | Yang | H10B 10/12 |

(Continued)

FOREIGN PATENT DOCUMENTS

CN 111653568 B 2/2023

OTHER PUBLICATIONS

"PCT International Search Report and Written Opinion in PCT/US2025/027882 dated Feb. 27, 2026, 8 pages".

*Primary Examiner* — Xia L Cross
(74) *Attorney, Agent, or Firm* — Servilla Whitney LLC

(57) ABSTRACT

Exemplary methods of manufacturing 2D DRAM and 3D DRAM devices include etching a portion of a low-k spacer material from a substrate. The methods may include exposing the remaining portion of the low-k spacer material of a 2D DRAM bit line to a carbon-containing precursor, to replenish the carbon content in the low-k spacer material. Additional methods may include exposing the remaining portion of the low-k spacer material of a 3D DRAM word line to a carbon-containing precursor to replenish the carbon content in the low-k spacer material. Further embodiments may include simultaneous treatment with ultraviolet (UV) radiation.

20 Claims, 5 Drawing Sheets

100

(56) References Cited

U.S. PATENT DOCUMENTS

| | | | |
|---|---|---|---|
| 2023/0070090 | A1 | 3/2023 | Liu |
| 2024/0120193 | A1 | 4/2024 | Venkataraman et al. |

* cited by examiner

METHOD AND STRUCTURE OF LOW-K SPACER USING POST-TREATMENT FOR MEMORY APPLICATIONS

TECHNICAL FIELD

Embodiments of the present disclosure pertain to the field of semiconductor devices and semiconductor device manufacturing. More particularly, embodiments of the disclosure provide DRAM devices with reduced consumption of the low-k spacer.

BACKGROUND

Electronic devices, such as personal computers, workstations, computer servers, mainframes, and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values but require periodic reprogramming or "refreshing" to maintain this voltage for more than very short periods of time.

DRAM memory circuits are manufactured by replicating billions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

A difficulty in reducing DRAM sizes is that the total thickness of spacer materials must also be reduced, currently to about 6 nm. After the bottom spacer material is etched to uncover silicon for formation of the contacts, the low-k spacer material on the sidewall is damaged. The low-k material can then be consumed by dilute hydrofluoric acid (DHF) used to remove native oxide formed on the silicon. Therefore, there is an ongoing need in the art for improved DRAM devices and methods of forming DRAM devices.

SUMMARY

One or more embodiments of the disclosure are directed to method of forming 2D DRAM semiconductor device. In one or more embodiments, the method comprises: patterning a plurality of bit lines on a substrate; forming a liner layer on a surface of each of the plurality of bit lines; depositing a low-k spacer material on the liner layer, the low-k spacer material having a first carbon content; etching a portion of the low-k spacer material from the plurality of bit lines to leave a remaining portion of the low-k spacer material, the remaining portion of the low-k spacer material having a second carbon content less than the first carbon content; and exposing the remaining portion of the low-k spacer material to a carbon-containing precursor to increase the second carbon content of the low-k spacer material and form a restored low-k spacer material.

One or more embodiments of the disclosure are directed to method of forming 3D DRAM semiconductor device. In one or more embodiments, the method comprises: depositing a word line fill material on a plurality of word lines; recessing a portion of each of the plurality of word lines to form a recess opening adjacent to each of the plurality of word lines; depositing a low-k spacer material in the recess opening, the low-k spacer material having a first carbon content; etching a portion of the low-k spacer material to leave a remaining portion of the low-k spacer material, the remaining portion of the low-k spacer material having a second carbon content less than the first carbon content; and exposing the remaining portion of the low-k spacer material to a carbon-containing precursor to increase the second carbon content of the low-k spacer material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1B:
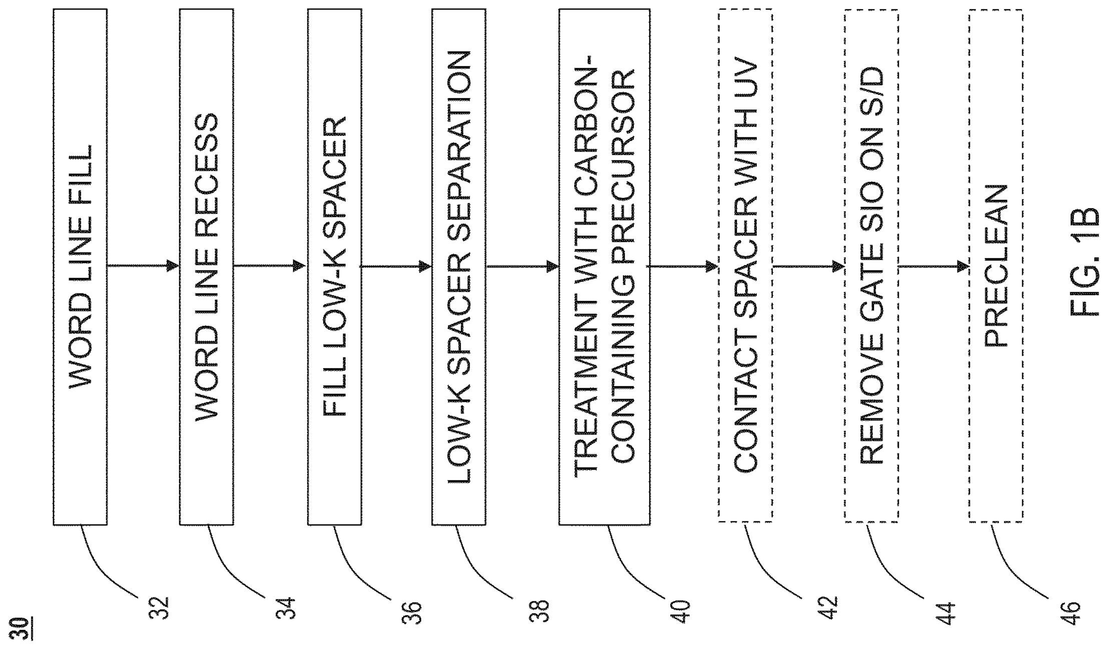
FIG. 1 illustrates a process flow diagram of a method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "on" indicates that there is contact between elements, and there may be intervening elements or layers. The term "directly on" indicates that there is direct contact between elements with no intervening elements.

As used herein, the term "dynamic random-access memory" or "DRAM" refers to a memory cell that stores a datum bit by storing a packet of charge (i.e., a binary one), or no charge (i.e., a binary zero) on a capacitor. The charge is gated onto the capacitor via an access transistor and sensed by turning on the same transistor and looking at the voltage perturbation created by dumping the charge packet on the interconnect line on the transistor output. Thus, a single DRAM cell is made of one transistor and one capacitor.

The manufacturing of a DRAM cell includes the fabrication of a transistor, a capacitor, and three contacts: one each to the bit line, the word line, and the reference voltage. There is a continuous desire to decrease the size of individual cells and to increase memory cell density to allow more memory to be included on a single memory chip, especially for densities greater than 256 Megabits. Limitations on cell size reduction include the passage of both active and passive word lines through the cell, the size of the cell capacitor, and the compatibility of array devices with non-array devices.

As used herein, the term "bit line" refers to a layer of material that is an electrical conductor. In one or more embodiments, the channel comprises one or more silicon, polysilicon, epitaxial silicon, amorphous silicon, doped silicon, strained silicon, silicon on insulator (SOI), carbon doped silicon oxides, SiGe, germanium, Epi Ge, Epi SiGe, gallium arsenide, GaN, InP, carbon nanotube, and any other materials such as 2D TMD metals, metal oxides, metal nitrides, metal alloys, and other conductive materials, depending on the application. In one or more embodiments, the bit line includes, without limitation, growth silicon. Bit line may be exposed to in-situ or ex-situ pretreatment and post-treatment process to fuse, freeze, heat, microwave, polish, etch, reduce, oxidize, hydroxylate, anneal, UV cure, e-beam cure and/or bake the bulk or surface of the bit line. In addition to film processing directly on the surface or bulk structure of the bit line itself, in the present disclosure, any of the film processing steps disclosed may also be performed on an underlayer formed on the bit line as disclosed in more detail below, and the term "bit line surface" is intended to include such underlayer as the context indicates. Thus, for example, where a film/layer or partial film/layer has been deposited onto a bit line surface, the exposed surface of the newly deposited film/layer becomes the bit line surface.

As used herein, the term "capacitor" refers to an electrical component of a memory cell. A capacitor has two electrical conductors separated by electrically insulating material.

As used herein, the term "active" or "memory layer" refers to a layer of material in which a channel, a bit line, a word line, or a capacitor can be made. In one or more embodiments, the memory layer comprises one or more of silicon or doped silicon. For example, in one or more embodiments, the memory layer is selected from one or more of Si, or IGZO (In—Ga—Zn Oxide).

In one or more embodiments, a silicon-containing low-k material having high conformality and low dielectric constant is used as a spacer material in a DRAM device. After some dry etching operations, such as spacer etchback or spacer separation, the remaining silicon-containing low-k material may be treated with a carbon-containing precursor with or without ultraviolet (UV) radiation. These treatments may return depleted carbon to the silicon-containing low-k material, increasing the material's resistance to subsequent wet etching operations.

In one or more embodiments, a 2D DRAM device is manufactured. In one or more embodiments, during the manufacturing process, the bit line spacer is etched backed, resulting in damage to the spacer material. In one or more embodiments, the bit line spacer is advantageously treated with a carbon-containing precursor treatment to recover the wet etch rate of the spacer material, recover the low k value of the spacer for improved capacitance, and to recover electrical isolation, breakdown voltage (BV), and leakage.

In other embodiments, a 3D DRAM device is manufactured. In one or more embodiments, during the manufacturing process, the word line channel capacitance is large when silicon nitride (SiN) or silicon oxynitride (SiON) are used. The adoption of low-k materials is challenging due to the loss of the low-k material in downstream processing steps such as gate oxide removal at the source/drain region and precleaning for source/drain contact formation. In one or more embodiments, the gate oxide material is recessed and filled with a low-k material which is then advantageously treated with a carbon-containing precursor treatment. In one or more embodiments, the treatment minimizes the low-k loss and improves the dielectric properties of the low-k material.

The embodiments of the disclosure are described by way of the Figures, which illustrate devices (e.g., DRAM) and processes for forming DRAMs in accordance with one or more embodiments of the disclosure. The processes shown are merely illustrative possible uses for the disclosed processes, and the skilled artisan will recognize that the disclosed processes are not limited to the illustrated applications.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. Thus, the regions illustrated in the figures are schematic in nature and their shapes may be not intended to illustrate the actual shape of a region of a device and are not intended to limit the scope of example embodiments.

Figure 1A:
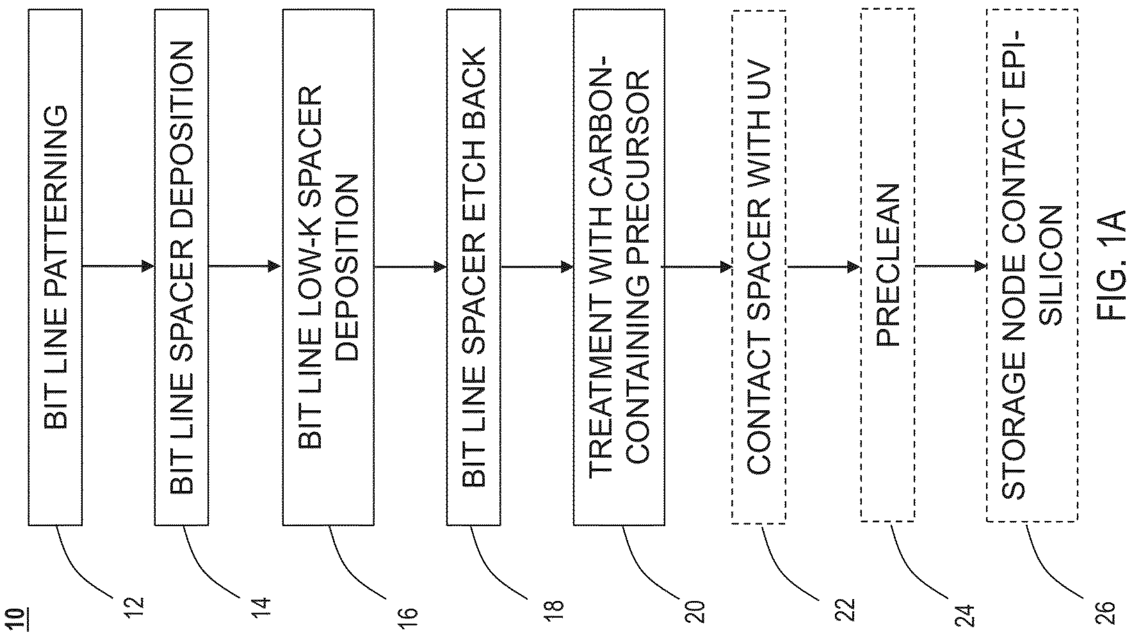

FIG. 1A illustrates a process flow diagram for a method 10 for forming a semiconductor device in accordance with some embodiments of the present disclosure. FIGS. 2A-2E illustrate cross-sectional views of a semiconductor device, a 2D DRAM device in particular, according to one or more embodiments. The method 10 is described below with respect to FIGS. 2A-2E. The method 10 may be part of a multi-step fabrication process of a semiconductor device, a 2D DRAM in particular.

Figure 2A:
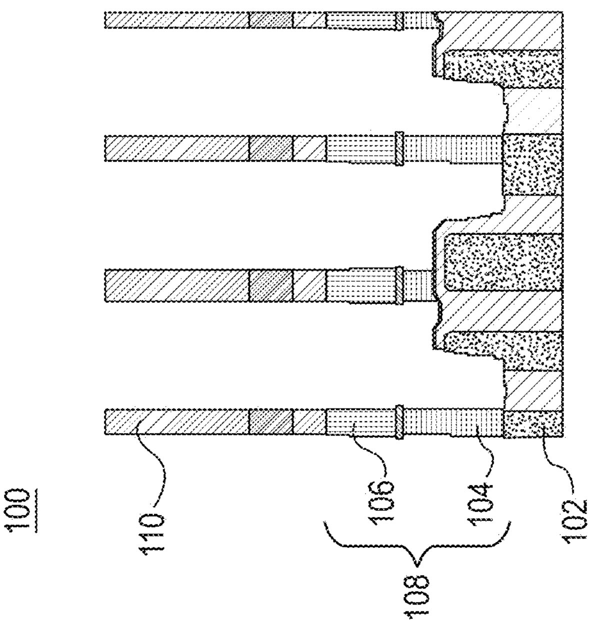
FIG. 2A illustrates a cross-section view of a DRAM device according to one or more embodiments.

Referring to FIG. 1A and FIG. 2A, at operation 12, a memory stack is provided and a plurality of bit lines 108 are patterned. As used herein, the term "provided" means that the substrate is made available for processing (e.g., positioned in a processing chamber). In one or more embodiments, the memory stack comprises a dielectric layer 110 formed on a metal layer 106, the metal layer 106 on an active layer 104, and the active layer 104 formed on a substrate 102.

The substrate 102 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

In one or more embodiments, an active layer 104 or a semiconductor layer is formed on the substrate 102. As used herein, the term "active" or "memory layer" refers to a layer of material in which a channel, a bit line, a word line, or a capacitor can be made. In one or more embodiments, the active layer comprises one or more of silicon or doped silicon.

The active layer 104 can be formed by any suitable technique known to the skilled artisan and can be made from any suitable material. In some embodiments, active layer 104 or the semiconductor material may be a doped material, such as n-doped silicon (n-Si), or p-doped silicon (p-Si). In some embodiments, the semiconductor material may be doped using any suitable process such as an ion implantation process. As used herein, the term "n-type" refers to semiconductor material layer that is created by doping with an electron donor element during manufacture. The term n-type comes from the negative charge of the electron. In n-type semiconductor material layers, electrons are the majority carriers and holes are the minority carriers. As used herein, the term "p-type" refers to the positive charge of a well (or hole). As opposed to n-type semiconductor materials, p-type semiconductor materials have a larger hole concentration than electron concentration. In p-type semiconductor materials, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the active layer 104 comprises several different conductive or semiconductor materials.

In one or more embodiments, a bit line metal layer 106 is formed on the active layer 104. The bit line metal layer 106 can be deposited by any suitable technique known to the skilled artisan and can be any suitable material. In one or more embodiments, forming the bit line 108 further comprises forming a bit line metal seed layer (not shown) prior to depositing the bit line metal layer 104. In one or more embodiments, the metal layer 106 comprises tungsten (W), ruthenium (Ru), molybdenum (Mo), or cobalt (Co).

In one or more embodiments, the dielectric layer 110 is formed on the bit line metal layer 106. The dielectric layer 110 can comprise any suitable dielectric material. As used herein, the term "dielectric material" refers to a layer of material that is an electrical insulator that can be polarized in an electric field. In one or more embodiments, the dielectric layer comprises one or more of oxides, carbon doped oxides, silicon oxide ($SiO_x$), silicon nitride (SiN), silicon oxide/silicon nitride, carbides, oxycarbides, nitrides, oxynitrides, oxycarbonitrides, polymers, phosphosilicate glass, fluorosilicate (SiOF) glass, organosilicate glass (SiOCH), silicon carbo nitride (SiCN), and silicon oxycarbo nitrides (SiOCN). In one or more embodiments, the dielectric layer includes, without limitation, furnace, CVD, PVD, ALD and spin-on-coat (SoC) deposited films. In one or more embodiments, the dielectric layer may be exposed to in-situ or ex-situ pretreatment and post-treatment process to dope, infuse, implant, heat, freeze, polish, etch, reduce, oxidize, hydroxylate, anneal, UV cure, e-beam cure and/or bake the surface or bulk of the dielectric. In one or more specific embodiments, the dielectric layer 110 comprises silicon nitride (SiN). The silicon nitride (SiN) may be doped or undoped. In some embodiments, the silicon nitride is doped with carbon (SiCN).

In one or more embodiments, the memory stack is patterned to form a plurality of bit lines 108 on the substrate.

Figure 2B:
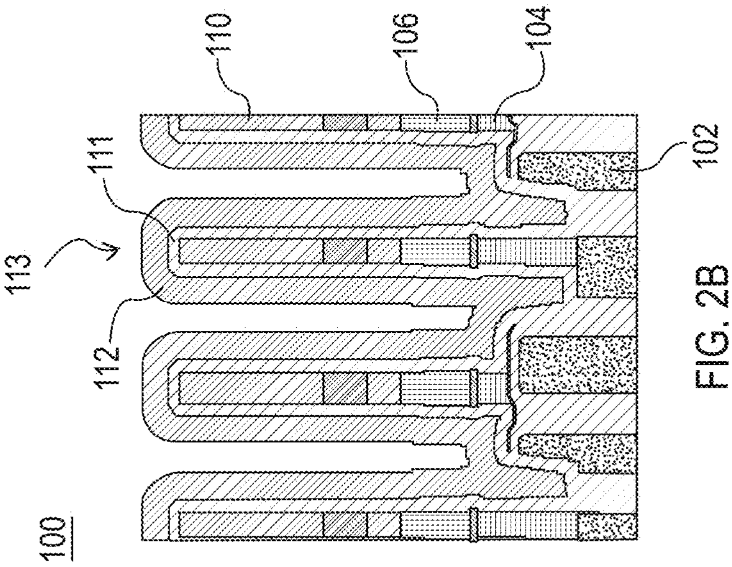
FIG. 2B illustrates a cross-section view of a DRAM device according to one or more embodiments.

With reference to FIG. 1A and FIG. 2B, at operation 14, a bit line liner layer 111 is deposited on the sidewall surface of the plurality of bit lines 108. The bit line liner layer 111 may comprise any suitable material known to the skilled artisan. In one or more embodiments, the bit line liner layer 111 comprises a dielectric material. In one or more specific embodiments, the bit line liner layer 111 comprises silicon nitride (SiN) or silicon oxide ($SiO_x$).

Referring to FIG. 1A and FIG. 2B, at operation 16, a low-k spacer material 112 is deposited on the bit line liner layer 111 such that the low-k spacer material 112 and the bit line liner layer 111 form a bit line spacer 113. In one or more embodiments, the low-k spacer material 112 comprises a low-k dielectric material. In certain embodiments, the low-k spacer material 112 comprises silicon oxide ($SiO_x$). In one or more embodiments, the low-k spacer material 112 comprises $SiO_xH_y(CH_z)$. Further embodiments provide that the low-k spacer material 112 comprises porous or carbon-doped $SiO_x$.

In some embodiments, the low-k spacer material 112 is a porous or carbon-doped $SiO_x$ layer with a k value less than about 5.

In one or more embodiments, the low-k spacer material 112 has a first carbon content. More specifically, an exposed surface of the low-k spacer material 112 may be characterized by a carbon concentration of greater than or about 15 at. %, such as greater than or about 16 at. %, greater than or about 17 at. %, greater than or about 18 at. %, greater than or about 19 at. %, greater than or about 20 at. %, greater than or about 21 at. %, greater than or about 22 at. %, greater than or about 23 at. %, greater than or about 24 at. %, greater than or about 25 at. %, or more. During the subsequent etching operation 18, carbon may be removed at a quicker rate relative to other elements in the low-k spacer material 112, such as silicon, oxygen, and other elements. Carbon may outgas during the etching of the low-k spacer material 112.

Figure 2E:
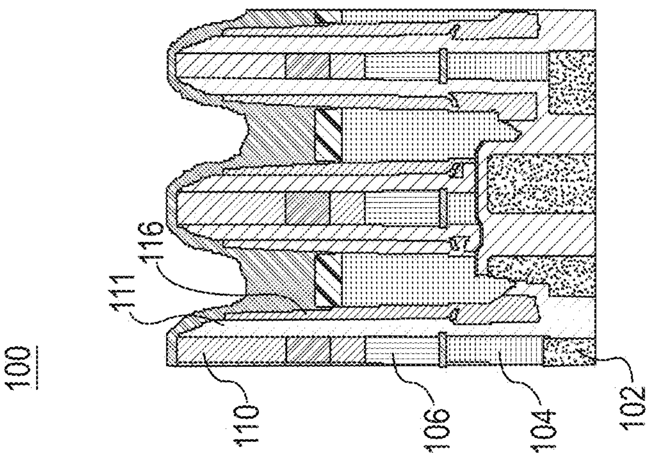
FIG. 2E illustrates a cross-section view of a DRAM device according to one or more embodiments.
Figure 2D:
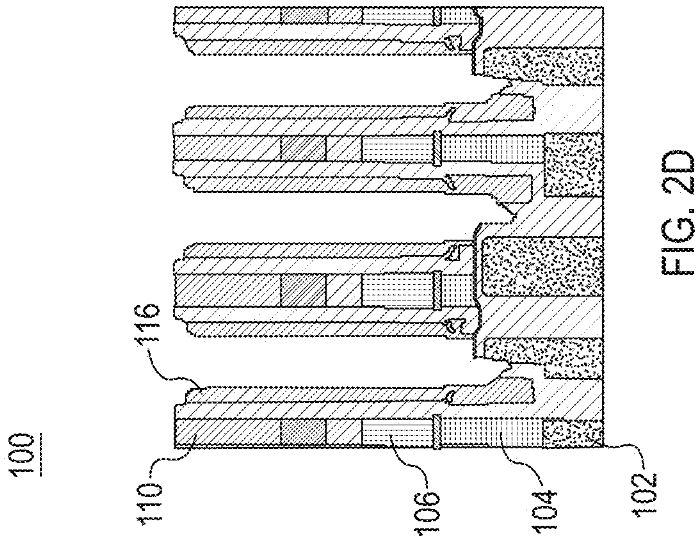
FIG. 2D illustrates a cross-section view of a DRAM device according to one or more embodiments.
Figure 2C:
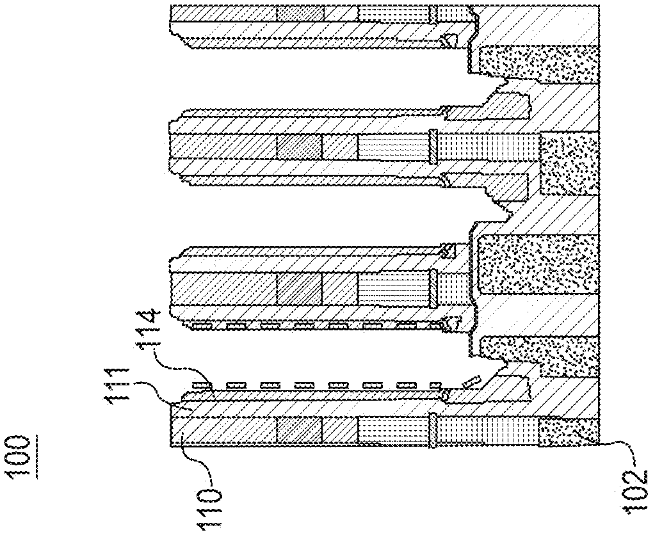
FIG. 2C illustrates a cross-section view of a DRAM device according to one or more embodiments.

With reference to FIG. 1A and FIG. 2C, at operation 18, the bit line spacer 113 is etched back, causing damage to the low-k spacer material 112 and forming a damaged low-k spacer material 114.

More specifically, at operation 18, in one or more embodiments, the methods of semiconductor processing may include etching a portion of a low-k spacer material 112 from the bit line liner layer 111. Any suitable etch process may be used. In one or more embodiments, the etching at operation 18 of method 100 may include providing one or more etchant precursors include, for example, a hydrogen-containing precursor, a nitrogen-containing precursor, an oxygen-containing precursor, or any other conventional semiconductor precursors used to remove silicon-containing material such as the material present in the bit line spacer 113. In one or more embodiments, the one or more etchant precursors may include diatomic hydrogen and diatomic nitrogen. In another embodiment, one or more etchant precursors may include diatomic hydrogen and molecular oxygen. In embodiments, method 100 may include forming a plasma of the one or more etchant precursors to increase bombardment and removal of the silicon-containing material of the low-k spacer material 112.

In one or more embodiments, the one or more etchant precursors may contact the bit line spacer 113 and remove a portion of the liner 111 or low-k spacer material 112, from the substrate. The etching may leave a damaged low-k spacer material 114.

After etching operation 18, the damaged low-k spacer material 114 may have a second carbon content. In one or more embodiments, the second carbon content of the damaged low-k spacer material 114 is less than the first carbon content of the low-k spacer material 112 prior to etching. In one or more embodiments, the damaged low-k spacer material 114 may be characterized by a carbon concentration of less than or about 15 at. %, such as less than or about 14 at. %, less than or about 13 at. %, less than or about 12 at. %, less than or about 11 at. %, less than or about 10 at. %, or less.

Conversely, an oxygen concentration in the damaged low-k spacer material 114 may increase during etching operation 18, which may be due to the interaction between the one or more etchant precursors, such as oxygen-containing precursors, and the low-k spacer material 112.

At operation 20, as illustrated in FIG. 1A and FIG. 2D, the damaged low-k spacer material 114 is treated with a carbon-containing precursor in the presence or absence of ultraviolet (UV) radiation.

At operation 20, the method 100 may include providing a carbon-containing precursor and contacting the remaining damaged low-k spacer material 114 with the carbon-containing precursor. The contacting with the carbon-containing precursor may replenish carbon in the low-k material to form a restored low-k spacer material 116, as illustrated in FIG. 2D. In some embodiments, contacting the remaining damaged low-k spacer material 114 with the carbon-containing precursor increases the carbon content of the low-k spacer material 114 to form a restored low-k spacer material 116. In one or more embodiments, the restored low-k spacer material 116 may have a third carbon content. In one or more embodiments, the third carbon content may be greater than the second carbon content. In one or more embodiments, the third carbon content may be less than or equal to the first carbon content. In other embodiments, the third carbon content may be greater than or equal to the first carbon content.

In one or more embodiments, the method may include generating a plasma of the carbon-containing precursor. The contacting of the damaged low-k spacer material 114 with the carbon-containing precursor may include contacting the damaged low-k spacer material 114 with plasma effluents of the carbon-containing precursor. The carbon-containing precursor may be or include hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) ($CH_3$—O—Si—$(CH_3)_3$), dimethyldimethoxysilane (DMDMS) ($(CH_3)_2$—Si—$((OCH_3)_2)$), methyltrimethoxysilane (MTMS) ($(CH_3$—$O)_3$—Si—$CH_3$), phenyltrimethoxysilane (PTMOS) ($C_6H_5$—Si—$(OCH_3)_3$), phenyldimethylchlorosilane (PDMCS) ($C_6H_5$—Si(Cl)—$(CH_3)_2$), dimethylaminotrimethylsilane (DMATMS) ($(CH_3)_2$—N—Si—$((CH_3)_3)$), or bis (dimethylamino)dimethylsilane (BDMADMS), as well as any other suitable carbon-containing precursor known to the skilled artisan.

In some embodiments, the carbon-containing precursor is mixed with one or more carrier gas. The carrier gas may comprise any suitable carrier gas, including, but not limited to, helium (He), argon (Ar), and diatomic nitrogen ($N_2$).

In one or more embodiments, the methods may include providing a carbon-containing precursor to a processing region of a semiconductor processing chamber. A substrate may be disposed within the processing region. An exposed surface of the damaged low-k spacer material 114 may be characterized by a first carbon concentration. The methods may include contacting the damaged low-k spacer material 114 with the carbon-containing precursor. In one or more embodiments, the contacting may increase the first carbon concentration to a second carbon concentration in the restored low-k spacer material 116.

In one or more embodiments, method 100 at operation 20 may include generating a plasma of the carbon-containing precursor. The plasma effluents of the carbon-containing precursor may be generated at a plasma power of less than or about 3000 W, and may be generated at a plasma power of less than or about 2750 W, less than or about 2500 W, less than or about 2250 W, less than or about 2000 W, less than or about 1750 W, less than or about 1500 W, less than or about 1250 W, less than or about 1000 W, less than or about 750 W, less than or about 500 W, less than or about 250 W, or less. While a plasma of the carbon-containing precursor may be generated in some embodiments, other embodiments may include a thermal process that does not include generating a plasma of the carbon-containing precursor.

At operation 20, method 100 may include contacting the remaining damaged low-k spacer material 114 with the carbon-containing precursor or the plasma effluents thereof.

Contacting the remaining damaged low-k spacer material 114 with the carbon-containing precursor may introduce carbon to the damaged low-k spacer material 114 to form the restore low-k spacer material 116. The introduction of carbon and contacting at operation 20 may replace carbon that was depleted during etching of the low-k silicon-containing spacer material 112 at operation 18. The carbon-containing compound may be provided in vapor phase, which may allow the carbon-containing precursor to penetrate deeply into the remaining damaged low-k spacer material 114. The vaporized carbon-containing precursor may be vaporized prior to being provided to the processing region or may be vaporized in the processing region.

In one or more embodiments, contacting the remaining damaged low-k spacer material 114 with the carbon-containing precursor or the plasma effluents thereof at operation 20 may increase the carbon concentration in the damaged low-k spacer material 114 to form the restored low-k spacer material 116. The carbon concentration may be increased to the concentrations previously discussed, such as concentrations prior to operation 18. For example, after operation 20, the exposed surface of the restored low-k spacer material 116 may be characterized by a carbon concentration of greater than or about 15 at. %, such as greater than or about 16 at. %, greater than or about 17 at. %, greater than or about 18 at. %, greater than or about 19 at. %, greater than or about 20 at. %, greater than or about 21 at. %, greater than or about 22 at. %, greater than or about 23 at. %, greater than or about 24 at. %, greater than or about 25 at. %, or more. In embodiments, contacting the remaining damaged low-k spacer material 114 with the carbon-containing precursor at operation 20 may increase the carbon concentration at the exposed surface of the damaged low-k spacer material 114 by greater than or about 5 at. %, such as greater than or about 6 at. %, greater than or about 7 at. %, greater than or about 8 at. %, greater than or about 9 at. %, greater than or about 10 at. %, or more.

At optional operation 22, method 100 may include exposing the substrate to ultraviolet (UV) radiation. The UV radiation source may be, for example, a UV lamp. The UV radiation source may be positioned outside of the semiconductor processing chamber, and the semiconductor processing chamber may have a quartz window through which UV radiation may pass. The DRAM device 100 may be positioned in an inert gas environment, such as, for example, helium, argon, or diatomic nitrogen. The processing semiconductor chamber may include a microwave source to heat the damaged low-k spacer material 114 prior to or concurrently with contacting the damaged low-k spacer material 114 with UV radiation. In embodiments, the UV radiation exposure may be conducted using a plasma to simulate UV radiation wavelengths. The plasma may be formed by coupling RF power to a treatment gas such as, for example, helium, argon, molecular oxygen, or diatomic oxygen. Exposing the damaged low-k spacer material 114 to UV radiation may break Si—H and/or Si—OH bonds in the material, allowing Si—$CH_2$—$CH_2$—$Si(CH_3)_3$ and/or Si—O—$Si(CH_3)_3$ bonds to form, thereby increasing the carbon concentration.

During operation 22, conditions of the UV radiation may be tailored to treat the damaged low-k spacer material 114. For example, a UV irradiance power may be characterized by between about 100 $W/m^2$ and about 2000 $W/m^2$. At UV irradiance powers less than 100 $W/m^2$, the UV radiation may not be significant enough to modify the material. At UV irradiance powers greater than 2000 $W/m^2$, the UV radiation may damage the material or structure. Additionally, a UV wavelength may be characterized by between about 100 nm and about 400 nm. A UV wavelength below 100 nm may require a special light source that may not be commonly available. A UV wavelength above 400 nm, such as visible light, may not have sufficient energy to modify the previously discussed bonds.

In one or more embodiments, contacting the remaining damaged low-k spacer material 114 with the carbon-containing precursor and exposing the substrate to ultraviolet (UV) radiation may be performed simultaneously. Specifically, operations 20 and 22 may be performed simultaneously to treat the remaining damaged low-k spacer material 114. However, it is still contemplated that the operations may be performed in sequence in some embodiments.

With reference to FIG. 1A and FIG. 2E, at operation 24, the processing of the 2D DRAM device continues with pre-cleaning the surface of the restored bit line spacer. And, at operation 26, the storage node contact (SNC) is formed.

Operation 24 may include providing a cleaning agent to the processing region of the semiconductor processing chamber. The cleaning agent may be any wet etchant and may be, for example, a fluorine-containing cleaning agent. In embodiments, the fluorine-containing cleaning agent may be or include dilute hydrofluoric acid (DHF). The method may include contacting the substrate with the cleaning agent. The cleaning agent may remove surface oxide from the substrate. The cleaning agent may be or include dilute hydrofluoric acid (DHF). The cleaning agent may be provided to clean the DRAM device 100 after etching and restoring the spacer to form the restored low-k spacer material 116.

Process conditions may impact the operations performed in method 100. Each of the operations of method 100 may be performed during a constant temperature in embodiments, while in some embodiments the temperature may be adjusted during different operations. In some embodiments of the present technology, method 100 may be performed at substrate, pedestal, and/or chamber temperatures less or about 500° C., which may be due to thermal budget issues, and may be performed at temperatures less than or about 475° C., less than or about 450° C., less than or about 425° C., less than or about 400° C., less than or about 375° C., less or about 350° C., less or about 325° C., less or about 300° C., less or about 275° C., less or about 250° C., or lower. The temperature may also be maintained at any temperature within these ranges, within smaller ranges encompassed by these ranges, or between any of these ranges. Forming material at increased temperatures may increase the amount of carbon introduced into the low-k silicon-containing spacer material 112 at operation 20 and, therefore, improve resistance to wet etchants. Accordingly, in some embodiments, the temperature may be maintained between at greater than or about 200° C. and may be maintained at greater than or about 225° C., greater than or about 250° C., greater than or about 275° C., greater than or about 300° C., greater than or about 325° C., greater than or about 350° C., or higher.

The pressure within the semiconductor processing chamber may also affect the operations performed. In one or more embodiments, the pressure may be maintained at less than about 40 Torr. Accordingly, the pressure may be maintained at less than or about 35 Torr, less than or about 30 Torr, less than or about 25 Torr, less than or about 20 Torr, less than or about 18 Torr, less than or about 16 Torr, less than or about 14 Torr, less than or about 12 Torr, less than or about 10 Torr, less than or about 8 Torr, less than or about 6 Torr, less than or about 4 Torr, less than or about 2 Torr, less than or about 1 Torr, or less. The pressure may also be maintained at any pressure within these ranges, within smaller ranges encompassed by these ranges, or between any of these ranges.

In conventional embodiments, the remaining damaged low-k spacer material 114, with reduced carbon concentration at the exposed surface of the damaged low-k spacer material 114 may have poor resistance to the cleaning agent at operation 24. In these conventional embodiments, the damaged low-k spacer material 114 may be removed entirely, which may damage or destroy the DRAM device 100. By treating the damaged low-k spacer material 114 with the carbon-containing precursor and/or exposing the damaged low-k spacer material 114 to UV radiation, carbon may be replenished to the damaged low-k spacer material 114 to form a restore low-k spacer material 116. The increased carbon concentration may increase the resistance of the restored low-k spacer material 116 to cleaning agents and other wet etchants used in processing. Conventional embodiments may immediately begin etching the low-k silicon-containing spacer material 112 when exposed to cleaning agents and other wet etchants whereas the present technology may resist any etching for greater than or about 5 seconds of exposure, such as greater than 10 seconds of exposure, greater than or about 15 seconds of exposure, greater than 20 seconds of exposure, greater than or about 25 seconds of exposure, greater than 30 seconds of exposure, greater than or about 35 seconds of exposure, greater than 40 seconds of exposure, or more.

FIG. 1B illustrates a process flow diagram for a method 30 for forming a semiconductor device in accordance with some embodiments of the present disclosure. FIGS. 3A-3E illustrate cross-sectional views of a semiconductor device, a 3D DRAM device in particular, according to one or more embodiments. The method 30 is described below with respect to FIGS. 3A-3E. The method 30 may be part of a multi-step fabrication process of a semiconductor device, a 3D DRAM in particular.

Figure 3B:
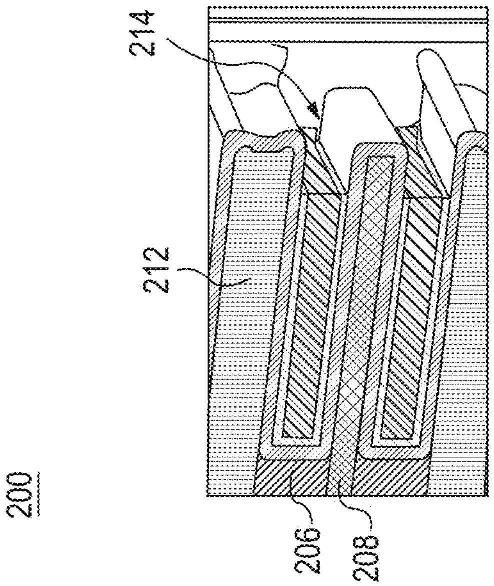
FIG. 3B illustrates a cross-section view of a DRAM device according to one or more embodiments.
Figure 3A:
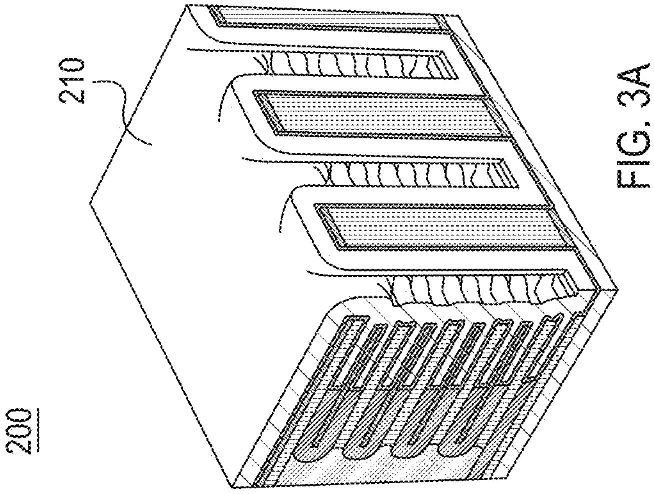
FIG. 3A illustrates a cross-section view of a DRAM device according to one or more embodiments.

Referring to FIG. 1B and FIG. 3A, at operation 32, a 3D DRAM device 200 is provided and the word line fill 210 is deposited. As used herein, the term "provided" means that the DRAM device is made available for processing (e.g., positioned in a processing chamber). In one or more embodiments, the word line fill 210 comprises any suitable material known to the skilled artisan. In one or more embodiments, the word line fill 210 comprises titanium nitride (TiN), tungsten (W), molybdenum (Mo), ruthenium (Ru), or combinations of these.

With reference to FIG. 1B and FIG. 3B, at operation 34, the word line 206 is recessed to form a recess opening 214 between the channel 208 and the dielectric layer 212. The recessing of the word line 206 may comprise any suitable recess process known to the skilled artisan.

Referring to FIG. 1B and FIG. 2C, at operation 36, a low-k spacer material 216 is deposited in the recess opening 214. In one or more embodiments, the low-k spacer material 216 comprises a low-k dielectric material. In certain embodiments, the low-k spacer material 216 comprises silicon oxide ($SiO_x$). In one or more embodiments, the low-k spacer material 216 comprises $SiO_xH_y(CH_z)$. Further embodiments provide that the low-k spacer material 216 comprises porous or carbon-doped $SiO_x$. In some embodiments, the low-k spacer material 216 is a porous or carbon-doped $SiO_x$ layer with a k value less than about 5.

In one or more embodiments, the low-k spacer material 216 has a first carbon content. More specifically, an exposed surface of the low-k spacer material 216 may be characterized by a carbon concentration of greater than or about 15 at. %, such as greater than or about 16 at. %, greater than or about 17 at. %, greater than or about 18 at. %, greater than or about 19 at. %, greater than or about 20 at. %, greater than or about 21 at. %, greater than or about 22 at. %, greater than or about 23 at. %, greater than or about 24 at. %, greater than or about 25 at. %, or more. During the subsequent node separation at operation 38, carbon may be removed at a quicker rate relative to other elements in the low-k spacer material 216, such as silicon, oxygen, and other elements. Carbon may outgas during the etching of the low-k spacer material 216.

Figure 3E:
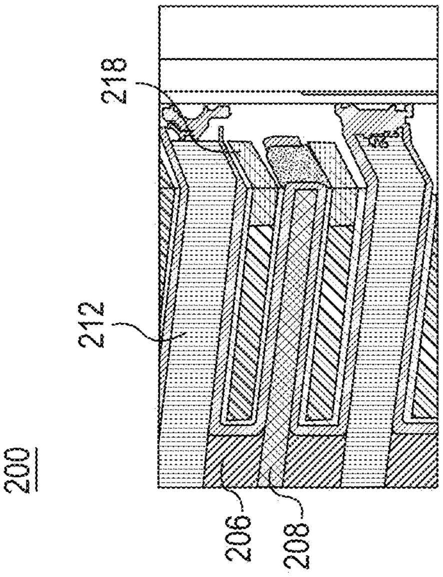
FIG. 3E illustrates a cross-section view of a DRAM device according to one or more embodiments.
Figure 3D:
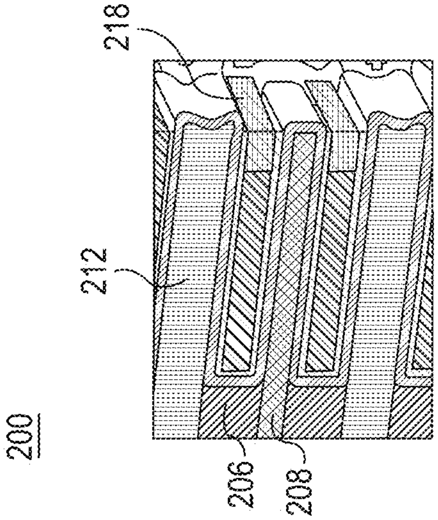
FIG. 3D illustrates a cross-section view of a DRAM device according to one or more embodiments.
Figure 3C:
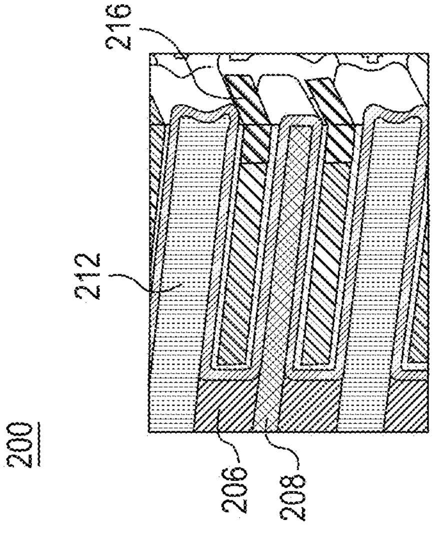
FIG. 3C illustrates a cross-section view of a DRAM device according to one or more embodiments.

With reference to FIG. 1B and FIG. 3C, at operation 38, node separation occurs, causing damage to the low-k spacer material 216.

More specifically, at operation 38, in one or more embodiments, the methods of semiconductor processing may include etching a portion of a low-k spacer material 216 from the word line cavity. Any suitable etch process may be used. In one or more embodiments, the etch process of operation 38 of method 200 may include providing one or more etchant precursors include, for example, a chlorine or fluorine containing precursor, a hydrogen-containing precursor, a nitrogen-containing precursor, an oxygen-containing precursor, or any other conventional semiconductor precursors used to remove silicon-containing material such as the material present in the low-k spacer material 216. In one or more embodiments, the one or more etchant precursors may include diatomic hydrogen and diatomic nitrogen. In another embodiment, one or more etchant precursors may include diatomic hydrogen and molecular oxygen. In embodiments, method 200 may include forming a plasma of the one or more etchant precursors to increase bombardment and removal of the low-k spacer material 216.

In one or more embodiments, the one or more etchant precursors may contact the substrate and remove a portion of the low-k spacer material 216, from the word line. The etching may leave a damaged portion of the low-k spacer material 216.

After operation 38, the damaged low-k spacer material 216 may have a second carbon content. In one or more embodiments, the second carbon content of the damaged low-k spacer material 216 is less than the first carbon content of the low-k spacer material 216 prior to etching. In one or more embodiments, the damaged low-k spacer material 216 may be characterized by a carbon concentration of less than or about 15 at. %, such as less than or about 14 at. %, less than or about 13 at. %, less than or about 12 at. %, less than or about 11 at. %, less than or about 10 at. %, or less.

Conversely, an oxygen concentration in the damaged low-k spacer material 216 may increase during etching operation 38, which may be due to the interaction between the one or more etchant precursors, such as oxygen-containing precursors, and the low-k silicon-containing spacer material 216 or breaking chemical bonds due to plasma damage.

At operation 40, as illustrated in FIG. 1B and FIG. 3D, the separated low-k spacer material 216 is treated with a carbon-containing precursor in the presence or absence of ultraviolet (UV) radiation.

At operation 40, the method 200 may include providing a carbon-containing precursor and contacting the damaged low-k spacer material 216 with the carbon-containing precursor. The contacting with the carbon-containing precursor may replenish carbon in the damaged low-k spacer material 216 to form a restored low-k spacer material 218, as illustrated in FIG. 3D. In some embodiments, contacting the remaining damaged low-k spacer material 216 with the carbon-containing precursor increases the carbon content of the damaged low-k spacer material 216 to form a restored low-k spacer material 218. In one or more embodiments, the restored low-k spacer material 218 may have a third carbon content. In one or more embodiments, the third carbon content may be greater than the second carbon content. In one or more embodiments, the third carbon content may be less than or equal to the first carbon content. In other embodiments, the third carbon content may be greater than or equal to the first carbon content.

In one or more embodiments, the method may include generating a plasma of the carbon-containing precursor. The contacting of the low-k spacer material 216 with the carbon-containing precursor may include contacting the low-k spacer material 216 with plasma effluents of the carbon-containing precursor. The carbon-containing precursor may be or include hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) ($CH_3$—O—Si—$(CH_3)_3$), dimethyldimethoxysilane (DMDMS) ($(CH_3)_2$—Si—$(OCH_3)_2$), methyltrimethoxysilane (MTMS) ($(CH_3$—$O)_3$—Si—$CH_3$), phenyltrimethoxysilane (PTMOS) ($C_6H_5$—Si—$(OCH_3)_3$), phenyldimethylchlorosilane (PDMCS) ($C_6H_5$—Si(Cl)—$(CH_3)_2$), dimethylaminotrimethylsilane (DMATMS) ($(CH_3)_2$—N—Si—$((CH_3)_3)$), or bis(dimethylamino)dimethylsilane (BDMADMS), as well as any other suitable carbon-containing precursor known to the skilled artisan.

In some embodiments, the carbon-containing precursor is mixed with one or more carrier gas. The carrier gas may comprise any suitable carrier gas, including, but not limited to, helium (He), argon (Ar), and diatomic nitrogen ($N_2$).

In one or more embodiments, the methods may include providing a carbon-containing precursor to a processing region of a semiconductor processing chamber. A substrate may be disposed within the processing region. An exposed surface of the low-k spacer material 216 may be characterized by a first carbon concentration. The methods may include contacting the low-k spacer material 216 with the carbon-containing precursor. In one or more embodiments, the contacting may increase the first carbon concentration to a second carbon concentration in the restored low-k spacer material 218.

In one or more embodiments, method 200 at operation 40 may include generating a plasma of the carbon-containing precursor. The plasma effluents of the carbon-containing precursor may be generated at a plasma power of less than or about 3000 W, and may be generated at a plasma power of less than or about 2750 W, less than or about 2500 W, less than or about 2250 W, less than or about 2000 W, less than or about 1750 W, less than or about 1500 W, less than or about 1250 W, less than or about 1000 W, less than or about 750 W, less than or about 500 W, less than or about 250 W, or less. While a plasma of the carbon-containing precursor may be generated in some embodiments, other embodiments may include a thermal process that does not include generating a plasma of the carbon-containing precursor.

At operation 40, method 200 may include contacting a remaining low-k spacer material 216 with the carbon-containing precursor or the plasma effluents thereof to form a restored low-k spacer material 218. Contacting remaining low-k spacer material 216 with the carbon-containing precursor may introduce carbon to the low-k spacer material 216 to form the restored low-k spacer material 218. The introduction of carbon and contacting at operation 40 may replace carbon that was depleted during the separation and etching of the low-k spacer material 216 at operation 38. The carbon-containing compound may be provided in vapor phase, which may allow the carbon-containing precursor to penetrate deeply into the remaining low-k spacer material 216 to form the restored low-k spacer material 218. The vaporized carbon-containing precursor may be vaporized prior to being provided to the processing region or may be vaporized in the processing region.

In one or more embodiments, contacting the remaining low-k spacer material 216 with the carbon-containing precursor or the plasma effluents thereof at operation 40 may increase the carbon concentration in the low-k spacer material 216. The carbon concentration may be increased to the concentrations previously discussed, such as concentrations prior to operation 38. For example, after operation 40, the exposed surface of the restored low-k spacer material 218 may be characterized by a carbon concentration of greater than or about 15 at. %, such as greater than or about 16 at. %, greater than or about 17 at. %, greater than or about 18 at. %, greater than or about 19 at. %, greater than or about 20 at. %, greater than or about 21 at. %, greater than or about 22 at. %, greater than or about 23 at. %, greater than or about 24 at. %, greater than or about 25 at. %, or more. In embodiments, contacting the remaining low-k spacer material 216 with the carbon-containing precursor at operation 40 may increase the carbon concentration at the exposed surface of the restored low-k spacer material 218 by greater than or about 5 at. %, such as greater than or about 6 at. %, greater than or about 7 at. %, greater than or about 8 at. %, greater than or about 9 at. %, greater than or about 10 at. %, or more.

At optional operation 42, method 200 may include exposing the substrate to ultraviolet (UV) radiation. The UV radiation source may be, for example, a UV lamp. The UV radiation source may be positioned outside of the semiconductor processing chamber, and the semiconductor processing chamber may have a quartz window through which UV radiation may pass. The 3D DRAM device 200 may be positioned in an inert gas environment, such as, for example, helium, argon, or diatomic nitrogen. The processing semiconductor chamber may include a microwave source to heat the low-k spacer material 216 prior to or concurrently with contacting the low-k spacer material 216 with UV radiation. In embodiments, the UV radiation exposure may be conducted using a plasma to simulate UV radiation wavelengths. The plasma may be formed by coupling RF power to a treatment gas such as, for example, helium, argon, molecular oxygen, or diatomic oxygen. Exposing the low-k spacer material 216 to UV radiation may break Si—H and/or Si—OH bonds in the material, allowing Si—$CH_2$—$CH_2$—$Si(CH_3)_3$ and/or Si—O—$Si(CH_3)_3$ bonds to form, thereby increasing the carbon concentration.

During operation 42, conditions of the UV radiation may be tailored to treat the low-k spacer material 216. For example, a UV irradiance power may be characterized by between about 100 $W/m^2$ and about 2000 $W/m^2$. At UV irradiance powers less than 100 $W/m^2$, the UV radiation may not be significant enough to modify the material. At UV irradiance powers greater than 2000 $W/m/^2$, the UV radiation may damage the material or structure. Additionally, a UV wavelength may be characterized by between about 100 nm and about 400 nm. A UV wavelength below 100 nm may require a special light source that may not be commonly available. A UV wavelength above 400 nm, such as visible light, may not have sufficient energy to modify the previously discussed bonds.

In one or more embodiments, contacting the remaining low-k spacer material 216 with the carbon-containing precursor and exposing the substrate to ultraviolet (UV) radiation may be performed simultaneously. Specifically, operations 40 and 42 may be performed simultaneously to treat the remaining low-k spacer material 216 to form the restored low-k spacer material 218. However, it is still contemplated that the operations may be performed in sequence in some embodiments.

With reference to FIG. 1B and FIG. 3E, at operations 44 and 46, the processing of the 3D DRAM device continues with removing the gate oxide on the source drain, pre-cleaning for source/drain doping, followed by barrier metal and metal fill according to standard processing of a 3D DRAM device.

Process conditions may impact the operations performed in method 200. Each of the operations of method 200 may be performed during a constant temperature in embodiments, while in some embodiments the temperature may be adjusted during different operations. In some embodiments of the present technology, method 200 may be performed at substrate, pedestal, and/or chamber temperatures less or about 500° C., which may be due to thermal budget issues, and may be performed at temperatures less than or about 475° C., less than or about 450° C., less than or about 425° C., less than or about 400° C., less than or about 375° C., less or about 350° C., less or about 325° C., less or about 300° C., less or about 275° C., less or about 250° C., or lower. The temperature may also be maintained at any temperature within these ranges, within smaller ranges encompassed by these ranges, or between any of these ranges. Forming material at increased temperatures may increase the amount of carbon introduced into the low-k silicon-containing spacer material 216 at operation 40 and, therefore, improve resistance to wet etchants. Accordingly, in some embodiments, the temperature may be maintained between at greater than or about 200° C. and may be maintained at greater than or about 225° C., greater than or about 250° C., greater than or about 275° C., greater than or about 300° C., greater than or about 325° C., greater than or about 350° C., or higher.

The pressure within the semiconductor processing chamber may also affect the operations performed. In one or more embodiments, the pressure may be maintained at less than about 40 Torr. Accordingly, the pressure may be maintained at less than or about 35 Torr, less than or about 30 Torr, less than or about 25 Torr, less than or about 20 Torr, less than or about 18 Torr, less than or about 16 Torr, less than or about 14 Torr, less than or about 12 Torr, less than or about 10 Torr, less than or about 8 Torr, less than or about 6 Torr, less than or about 4 Torr, less than or about 2 Torr, less than or about 1 Torr, or less. The pressure may also be maintained at any pressure within these ranges, within smaller ranges encompassed by these ranges, or between any of these ranges.

In conventional embodiments, the remaining low-k spacer material 216, with reduced carbon concentration at the exposed surface of the low-k spacer material 216 may have poor resistance to the cleaning agent at operation 46. In these conventional embodiments, the low-k spacer material 216 may be removed entirely, which may damage or destroy the DRAM device 200. By treating the low-k spacer material 216 with the carbon-containing precursor and/or exposing the low-k spacer material 216 to UV radiation, carbon may be replenished to the restored low-k spacer material 218. The increased carbon concentration may increase the resistance of the restored low-k spacer material 218 to cleaning agents and other wet etchants used in processing. Conventional embodiments may immediately begin etching the low-k spacer material 216 when exposed to cleaning agents and other wet etchants whereas the present technology may resist any etching for greater than or about 5 seconds of exposure, such as greater than 10 seconds of exposure, greater than or about 15 seconds of exposure, greater than 20 seconds of exposure, greater than or about 25 seconds of exposure, greater than 30 seconds of exposure, greater than or about 35 seconds of exposure, greater than 40 seconds of exposure, or more.

According to one or more embodiments, the substrate is subjected to processing prior to and/or after treating the low-k silicon-containing spacer material. This processing can be performed in the same chamber or in one or more separate processing chambers. In some embodiments, the substrate or device is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at the front end of the cluster tool. Any suitable cluster tool known to the skilled artisan may be adapted for the present disclosure. The exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., molybdenum- and silicon-containing precursor, silane reactant, etc.). According to one or more embodiments, a purge gas is injected at the exit of the deposition chamber to prevent reactants (e.g., molybdenum- and silicon-containing precursor, silane reactant, etc.) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into the first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent to the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a 2D DRAM semiconductor device, the method comprising:
- patterning a plurality of bit lines on a substrate;
- forming a liner layer on a surface of each of the plurality of bit lines;
- depositing a low-k spacer material on the liner layer, the low-k spacer material having a first carbon content;
- etching a portion of the low-k spacer material from the plurality of bit lines to leave a remaining portion of the low-k spacer material, the remaining portion of the low-k spacer material having a second carbon content less than the first carbon content; and
- exposing the remaining portion of the low-k spacer material to a carbon-containing precursor to increase the second carbon content of the low-k spacer material and form a restored low-k spacer material.

2. The method of claim 1, wherein the low-k spacer material comprises silicon oxide ($SiO_x$).

3. The method of claim 2, wherein the low-k spacer material comprises porous or carbon-doped $SiO_x$.

4. The method of claim 1, wherein the low-k spacer material comprises $SiO_xH_y(CH_z)$.

5. The method of claim 1, further comprising generating a plasma of the carbon-containing precursor, wherein exposing the remaining portion of the low-k spacer material to the carbon-containing precursors comprises contacting the remaining portion of the low-k spacer material with plasma effluents of the carbon-containing precursor.

6. The method of claim 5, wherein the plasma has a plasma power less than or equal to about 3000 W.

7. The method of claim 1, wherein the carbon-containing precursor is selected from the group consisting of hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) ($CH_3$—O—Si—$(CH_3)_3$), dimethyldimethoxysilane (DMDMS) ($(CH_3)_2$—Si—$((OCH_3)_2)$, methyltrimethoxysilane (MTMS) ($(CH_3$—O$)_3$—Si—$CH_3$), phenyltrimethoxysilane (PTMOS) ($C_6H_5$—Si—$(OCH_3)_3$), phenyldimethylchlorosilane (PDMCS) ($C_6H_5$—Si(Cl)—$(CH_3)_2$), dimethylaminotrimethylsilane (DMATMS) ($(CH_3)_2$ —N—Si—$((CH_3)_3)$, and bis(dimethylamino)dimethylsilane (BDMADMS).

8. The method of claim 1, further comprising exposing the 2D DRAM device to ultraviolet (UV) radiation after exposing the remaining portion of the low-k spacer material to the carbon-containing precursor.

9. The method of claim 8, wherein exposing the remaining portion of the low-k spacer material to the carbon-containing precursor and exposing the remaining portion of the low-k spacer to ultraviolet (UV) radiation are performed simultaneously.

10. The method claim 8, wherein:

a UV irradiance power is in a range of from about 100 $W/m^2$ and about 2000 $W/m^2$; and a UV wavelength is in a range of from about 100 nm to about 400 nm.

11. The method of claim 1, wherein the method is conducted at a temperature less than or equal to about 500° C.

12. The method of claim 1, further comprising cleaning the DRAM semiconductor device with a cleaning agent.

13. A method of forming a 3D DRAM semiconductor device, the method comprising:

depositing a word line fill material on a plurality of word lines;

recessing a portion of each of the plurality of word lines to form a recess opening adjacent to each of the plurality of word lines;

depositing a low-k spacer material in the recess opening, the low-k spacer material having a first carbon content;

etching a portion of the low-k spacer material to leave a remaining portion of the low-k spacer material, the remaining portion of the low-k spacer material having a second carbon content less than the first carbon content; and exposing the remaining portion of the low-k spacer material to a carbon-containing precursor to increase the second carbon content of the low-k spacer material.

14. The method of claim 13, wherein the low-k spacer material comprises silicon oxide ($SiO_x$).

15. The method of claim 14, wherein the low-k spacer material comprises porous or carbon-doped $SiO_x$.

16. The method of claim 13, further comprising generating a plasma of the carbon-containing precursor, wherein exposing the remaining portion of the low-k spacer material to the carbon-containing precursors comprises contacting the remaining portion of the low-k spacer material with plasma effluents of the carbon-containing precursor.

17. The method of claim 16, wherein the plasma has a plasma power less than or equal to about 3000 W.

18. The method of claim 13, wherein the carbon-containing precursor is selected from the group consisting of hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) ($CH_3$—O—Si—$(CH_3)_3$), dimethyldimethoxysilane (DMDMS) ($(CH_3)_2$—Si—$((OCH_3)_2)$), methyltrimethoxysilane (MTMS) ($(CH_3$—$O)_3$—Si—$CH_3$), phenyltrimethoxysilane (PTMOS) ($C_6H_5$—Si—$(OCH_3)_3$), phenyldimethylchlorosilane (PDMCS) ($C_6H_5$—Si(Cl)—$(CH_3)_2$), dimethylaminotrimethylsilane (DMATMS) ($(CH_3)_2$ —N—Si—$((CH_3)_3)$), and bis(dimethylamino)dimethylsilane (BDMADMS).

19. The method of claim 13, further comprising exposing the 3D DRAM device to ultraviolet (UV) radiation after exposing the remaining portion of the low-k spacer material to the carbon-containing precursor.

20. The method of claim 19, wherein exposing the remaining portion of the low-k spacer material to the carbon-containing precursor and exposing the remaining portion of the low-k spacer to ultraviolet (UV) radiation are performed simultaneously.

* * * * *